United States Patent
Danilatos

(10) Patent No.: US 6,396,063 B1
(45) Date of Patent: May 28, 2002

(54) RADIOFREQUENCY GASEOUS DETECTION DEVICE (RF-GDD)

(76) Inventor: Gerasimos Daniel Danilatos, 98 Brighton Boulevard, North Bondi, NSW 2026 (AU)

( * ) Notice: Subject to any disclaimer, the term of this patent is extended or adjusted under 35 U.S.C. 154(b) by 0 days.

(21) Appl. No.: 09/555,098

(22) PCT Filed: Nov. 18, 1998

(86) PCT No.: PCT/AU98/00954
§ 371 (c)(1),
(2), (4) Date: May 24, 2000

(87) PCT Pub. No.: WO99/27559
PCT Pub. Date: Jun. 3, 1999

(30) Foreign Application Priority Data

Nov. 24, 1997 (AU) .............................................. PP0497
May 22, 1998 (AU) .............................................. PP3637

(51) Int. Cl.⁷ ............................................. H01J 37/244
(52) U.S. Cl. ........................ 250/386; 250/387; 250/310; 250/397; 250/374
(58) Field of Search ................................ 250/386, 387, 250/374, 310, 397

(56) References Cited

U.S. PATENT DOCUMENTS

| | | | |
|---|---|---|---|
| 4,563,579 A | 1/1986 | Kellerhals et al. | 250/291 |
| 4,785,182 A | 11/1988 | Mancusco et al. | 250/310 |
| 4,897,545 A | 1/1990 | Danilatos | 250/310 |
| 4,992,662 A * | 2/1991 | Danilatos | 250/310 |
| 6,011,265 A * | 1/2000 | Sauli | 250/374 |

FOREIGN PATENT DOCUMENTS

GB 1403507 8/1975 ............ H01J/39/28

OTHER PUBLICATIONS

Nucl. Instr. and Meth., vol. B40/41, issued 1989 (North Holland, Amsterdam), J.E. turner et al, "Digital Characterisation of Recoil Charged–Particle Tracks for Neutron Measurments", pp. 1219–1223, section 5–6; Fig. 2.

Nucl. Instr. and Meth., vol. A260, issued 1987 (North Holland, Amsterdam), S.R. Hunter, "Evaluation of a Digital Optical Ionizing Radiation Particle Track Detector", pp. 469–477 p. 470, col. 2; Fig. 2 whole document.

* cited by examiner

Primary Examiner—Bruce Anderson
Assistant Examiner—Nikita Wells
(74) Attorney, Agent, or Firm—Michael Bednarek; Shaw Pittman LLP

(57) ABSTRACT

An alternating electromagnetic field in the radiofrequency range is applied in a gaseous environment (4). Free electrons produced in the gas (4), by an ionising source of radiation (5) or by interaction of a charged particle beam with a specimen, are acted upon by the alternating electromagnetic field and undergo an oscillatory motion resulting in multiple collisions with the gas molecules or atoms. Amplified electron and photon signals are generated in a controlled discharge, proportional to the initial number of free electrons, and are collected by suitable means (6, 7, 8). The alternating field is generated either by electrodes (1, 2) biased with an alternating voltage, or by a coil driven by an AC current, and may be superposed with a static electric field. The detection device may be used with instruments such as electron microscopes, in ion beam technologies, and with instruments used for detection of ionising radiations such as proportional counters.

20 Claims, 2 Drawing Sheets

RADIOFREQUENCY GASEOUS DETECTION DEVICE (RF-GDD)

TECHNICAL FIELD

This invention pertains to the technical field of physical sciences and technology. A novel detector is disclosed which can be used with instruments generating ionising radiations in a gaseous environment. This detector can be used also for particle measurements such as in the field of nuclear methods and instruments.

BACKGROUND ART

Conventionally, instruments employing electron and ion beams utilise a vacuum envelope into which the electron or ion beam is generated and applied. Such beams usually impinge on a specimen with which they interact and generate various products, or signals, such as electrons, ions, molecular fragments and x-rays or other photons. These instruments are used for imaging, testing, analysis, or modification of the surface of a specimen. To study a specimen, we need to detect the products of the beam-specimen interaction by suitable detection means usually placed inside the vacuum envelope of the instrument. However, a more recent generation of related instruments allows the examination of specimens inside a gaseous envelope with substantial pressure.

One electron beam instrument that allows the examination of a specimen in a gaseous environment is the environmental scanning electron microscope (ESEM) as disclosed by references 1 through to 10 below. This instrument employs a scanning electron beam that is generated in the vacuum envelope of an electron optics system. The vacuum envelope communicates with a specimen chamber via two small apertures which limit the flow of gas in the vacuum column to a negligible amount. Practically, most of the gas leaking through the first aperture from the specimen chamber is pumped out and only a very small amount of gas escapes into the vacuum of the electron optics column which is also pumped out and maintained in vacuum. The electron beam reaches the specimen through the two apertures with sufficient current still in a focussed condition. The focussed electron beam scans a very small surface area of the specimen in a raster form and releases various signals. One type of signal is electrons of low energy, called secondary electrons (SE). The SE are released in the gaseous environment and are detected with suitable means as disclosed by Danilatos in the references cited. Another type of signal generated is electrons of high energy, called backscattered electrons (BSE). The BSE, in turn, release free electrons of low energy from the gas molecules. The latter free electrons are also detected by suitable means as disclosed by Danilatos and summarised below.

The detection of free electrons of low energy in the gas of an ESEM is achieved by subjecting the electrons to a static electric field of sufficient intensity. As a result of the action of the external field, a controlled electrical discharge develops that multiplies the initial free electrons. The avalanche multiplication of the electrons is also accompanied by an avalanche of photon generation and multiplication in the gas. The discharge is controlled by the applied bias and develops as long as there is an initial supply of free electrons, whilst the discharge is extinguished when the supply source is eliminated. In other words, the amplified output signal is practically proportional to the input intensity of the source. The output signal is collected by suitable means, such as biased electrodes and photon detectors. In prior art, the same principle has been applied for detection and counting of ionising particles in particle physics, namely, by the proportional counter.

Although the principle on which proportional counters operate has been known art in the field of particle physics and nuclear instruments for a long time, the application of the same principle for the development of a detector in an ESEM has led to a series of new inventions and patents given by references 1 through to 6.

The present invention discloses a novel detector for free electrons of low energy in a gaseous environment of instruments employing electron and ion beams, or in the gaseous environment of a particle counter, in general. The novelty of this invention is primarily based on the introduction of an alternating electromagnetic field which can generate an electron and photon discharge in a gaseous environment. The use of an alternating field instead of a static field provides for novel and alternative means of detection for several instruments and has certain advantages over previous art.

The principle and application of an alternating electromagnetic field to create an electrodeless self-sustained discharge for completely different purposes has been previously presented by other workers as in references 11 through to 15. The same principle is also used for the generation of ion sources in various instruments. In all prior art, this principle has been used mainly in a self-sustained discharge mode for generating ions; however, it has never previously been disclosed or used as a proportional amplifier and detector of ionising radiations in a controlled discharge regime which takes place below the breakdown voltage of a self-sustained discharge.

DETAILED DISCLOSURE OF THE INVENTION

This invention relates to a novel detection system for instruments employing focussed charged particle beams such as electron or ion microscopes and for technologies generally employing focussed electron or ion beams. Electron and ion microscopes are a sub-class of the latter instruments and ESEM is one form of an electron microscope. The ionising radiations emanating from the specimens under examination in those instruments as well as the ionising particles used in other fields of science can be detected by a novel method and apparatus disclosed by the present invention herein.

According to the present invention, a volume of gas is acted upon by an alternating (oscillating) electromagnetic field in the radiofrequency range, preferably but not limited, anywhere between 1 MHz and 1 GHz. Both the frequency and amplitude of oscillation are variable within a particular working range for each technological case. The working range depends on the nature of gas, pressure of gas and geometry of the detection volume. When one or more electrons are released in the gas by any source, the electrons are acted upon by the alternating field and are forced to oscillate and collide with the gas molecules or atoms. Some electron collisions ionise the gas molecules or atoms and create electron/ion pairs, while some other electron collisions excite the gas molecules or atoms and release photons. The electrons may also collide repeatedly with the surrounding walls generating new electrons. By such mechanisms the initial electron signal is multiplied in an avalanche form. The predominant mechanism of electron multiplication is determined by the chosen frequency, pressure, geometry and nature of gas, and the effects can be controlled accordingly. Now, it is an essential feature and requirement of the present invention that the amplitude of oscillation of the applied field is kept below the sparking value, i.e. below the point where the avalanche becomes self-sustained and uncontrollable. When this requirement is met, the discharge is controlled and is said to operate in the proportional region, where the amplified current is proportional to the initial number of free electrons released in the gas. The sparking value of the field depends on the chosen frequency, geometrical configuration, gas pressure and nature of gas. The preferred values of all these parameters depend on the instrument and application with which this invention is used and do not restrict the scope and spirit of the invention.

For the purposes of the present description of the invention the term "electromagnetic" refers to either (a) the field generated between two electrodes biased with an alternating voltage and creating a predominantly alternating electric component of field with negligible magnetic component, or (b) the field created by an alternating electric current through a coil with both an alternating electric and magnetic component present.

In one form of the present invention, the amplified electric current (i.e. the electron avalanche) generated by the applied alternating field is collected by a set of electrodes properly biased to attract the electrons and ions, respectively. The collected current is further processed by known art in electronics circuitry.

In another form of the present invention, the amplified photons (i.e. the photon avalanche) concomitant with the electron avalanche are collected by a set of light guides and pipes leading to a photosensitive device, such as a photomultiplier. This variant form of signal collection is equivalent to the proportional scintillation counters used in particle physics, except that, herewith, the external field is oscillating instead of being static as in previous art. This constitutes a novel device which has several advantages over all prior art used in microscopy and related fields, and in particle physics, in general.

It is an object of the present invention to provide a novel detector which can be used in instruments employing a focussed charged particle beam. Usually, the beam (probe) is scanned over a specimen surface in a raster form and it spends a characteristic "dwell time" on every pixel element. The beam releases slow electrons from every pixel element of the specimen. The number of released electrons generally differs from pixel to pixel and characterises the variable properties of the specimen surface from point to point. According to the present invention, the specimen and its surrounding volume of gas is acted upon by an alternating electromagnetic field in the radiofrequency range. Both the frequency and amplitude of oscillation are variable in order to establish a working range for each case. The oscillating field of the present detector performs several oscillations during the dwell time over one pixel element. By the mechanism of the present invention described above, the initial number of free electrons multiply in an avalanche form. Similarly, an avalanche of photons is generated. The avalanche process is repeated for every pixel element of the specimen. Either the electron signal or the photon signal is collected and processed in the usual way by known art to form an image, or for other analysis and testing.

It is a further object of this invention to provide a detector for fast electrons released in instruments employing charged particle beams. The fast electrons released by the beam-specimen interaction (i.e. the BSE) traverse a volume of gas and collide with the gas molecules or atoms releasing, in turn, slow electrons. These slow electrons are subsequently multiplied by the mechanism of the oscillating field as disclosed in the present invention.

It is yet another object of this invention to provide a detector for any fast particles, in general, which can ionise the gas and release electro/ion pairs which are then subjected to the action of the alternating field as disclosed by the present invention.

The fundamental features of the present invention which constitute an inventive step are: (a) The use of an alternating electromagnetic field to act on electrons released in a gaseous volume by an incident radiation, (b) an avalanche multiplication of the initial electrons and an avalanche generation of photons, (c) the collection of electrons, or photons, or both, (d) the use of these mechanisms as a detection method and apparatus. The present system is governed by its own physical parameters, and its operation and use as a detector in scanned beam instruments has not been disclosed in any previous art. Likewise, its operation and use as a particle detector, in general, has not been used in any previous art.

It should be appreciated that there are various embodiments of this invention, all of which comprise the same set of fundamental features, but do not depart from the scope of the invention. It will be apparent to those skilled in the art that various changes and modifications may be made therein without departing from the spirit of the invention. All of these possible embodiments may vary among themselves to the degree that the present invention is adapted to various applications. Some of these variations are described first in general terms below.

The amplified electron/ion signal can be collected by suitable means. Such means can be the same electrodes with which we apply the oscillating electromagnetic field, in which case known modulation/demodulation techniques are used. Alternatively, the amplified electron/ion signal can be collected by separate electrodes.

All collection electrodes can be biased with an adjustable static (d-c) voltage in order to control the direction and amount of electron/ion flow. The alternating field can thus be superimposed with a d-c field in order to better define the detection volume and extract various signals.

Optionally and where possible, a static, or an alternating magnetic field can be added. The presence of a magnetic field causes the trajectories of the electrons to traverse a longer distance and thus increase the chances of collisions with gas molecules or atoms in cases of low gas pressure. For purposes of image quality, efficiency, gain, signal separation, charge and noise suppression, an array or system of electrodes of varying geometry, position and configuration is employed. The electrodes can be made in the form of plates, wires or meshes. The materials used for electrodes have suitable electrical properties and can be conductive, semiconductive and resistive materials.

In electron microscopes, it is necessary to protect the incident electron beam from possible influence of the alternating field, and suitable precautions are taken according to known art. For example, an ancillary electrode can be inserted to shield or guard the electron beam. Alternatively, the alternating field should be far removed from the beam to minimise any adverse effects.

The signal pick-up electrodes are connected to the input of an electronics amplifier for further signal processing. Known art of electronics engineering is used to separate the useful signal from unwanted effects.

These and further objects of the invention will be apparent from the following description of the invention as illustrated in the accompanying three Figures.

MODES FOR CARRYING OUT THE INVENTION

To assist with understanding of the invention, reference will now be made to the accompanying drawings which embody some examples of the invention and describe certain modes for carrying out the invention.

Figure 1:
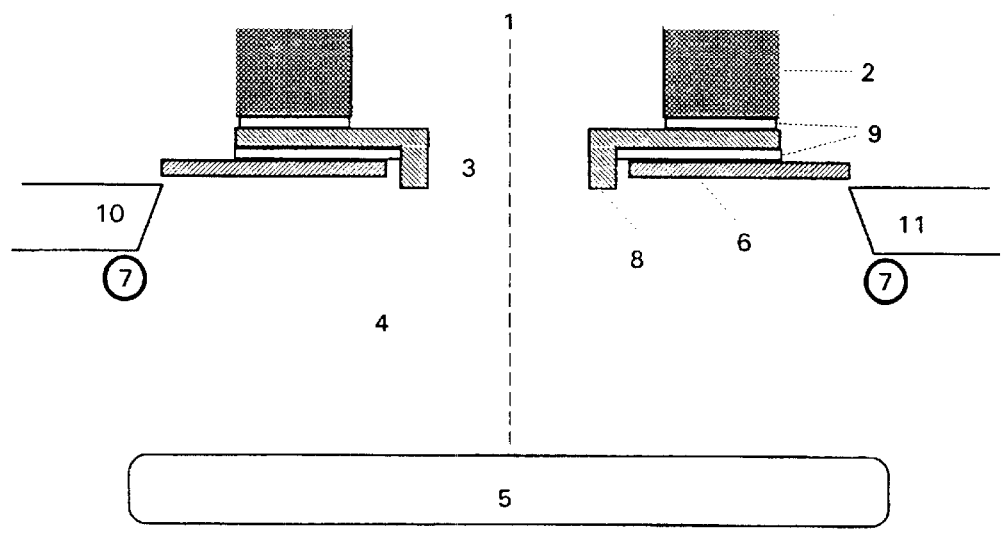
FIG. 1 General schematic diagram of the radio-frequency gaseous detection device with an alternating electric field, suitable for charged particle beam instruments.

One embodiment of the present invention suitable for instruments using a charged particle beam is shown in FIG. 1. A beam 1 is formed inside a column 2, said beam passes through a pressure limiting aperture 3 and traverses a distance in a gaseous environment 4 under conditions that allow the beam to reach a specimen 5 in a focussed spot. The beam interacts with the specimen and releases secondary electrons which are acted upon by an alternating electric field generated by an alternating bias applied to an annular electrode 6. The electrons released from the specimen are acted upon by the alternating field and are forced to oscillate and collide with the gas molecules thereby being multiplied in an avalanche form. The multiplied electrons are collected by an anode electrode and the ions are collected by a cathode electrode whereby the anode has a higher electrical potential than the cathode. Electrode 6 can also act as an anode but an independent anode 7 is preferred in this embodiment. Anode 7 is depicted as a wire electrode in a ring shape, but other shapes are also possible. The specimen 5 itself can be used as cathode but any other ancillary electrode may also be inserted to act as cathode, such as, for example, the specimen holder. Usually, the specimen is held at ground potential and the anode at a positive potential, but, generally, the potential difference between anode and cathode is what matters. The potential gradients between the specimen and various electrodes are formed so as to direct the produced electric current (electrons and ions) in the desired direction. An ancillary electrode 8 is inserted for the purpose of guarding the incident beam from unwanted interference by the added fields. Insulating materials 9 are used to separate various electrodes. Alternatively, or additionally, the accompanying photon avalanche in the discharge is collected by light pipes 10 and 11 leading to photomultipliers, or other photo-sensitive devices.

Figure 2:
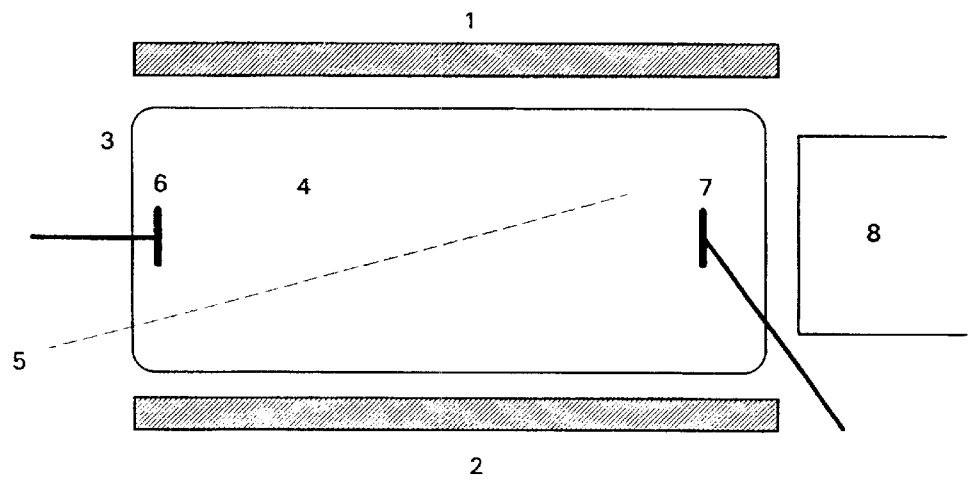
FIG. 2 General schematic diagram of the radiofrequency gaseous detection device with an alternating electric field, suitable as proportional counter in particle physics.

Another embodiment of the invention suitable for particle detection and counting is shown in FIG. 2. An alternating electric field is generated between electrodes 1 and 2 wherein a sealed glass container 3 with a suitable gas 4 is located. An ionising particle 5 traversing the gas frees electrons in the gas, said electrons are acted upon by the alternating electric field and are multiplied by repeated collisions with the gas molecules or atoms. The amplified current of electrons and ions is collected by the cathode 6 and anode 7, and the corresponding current is processed in an external circuit by known art. Alternatively, or additionally, the photon avalanche, which is also generated in the gas, is collected by a light pipe 8 leading to a photomultiplier or other photo-sensitive device for further processing according to known art.

Figure 3:
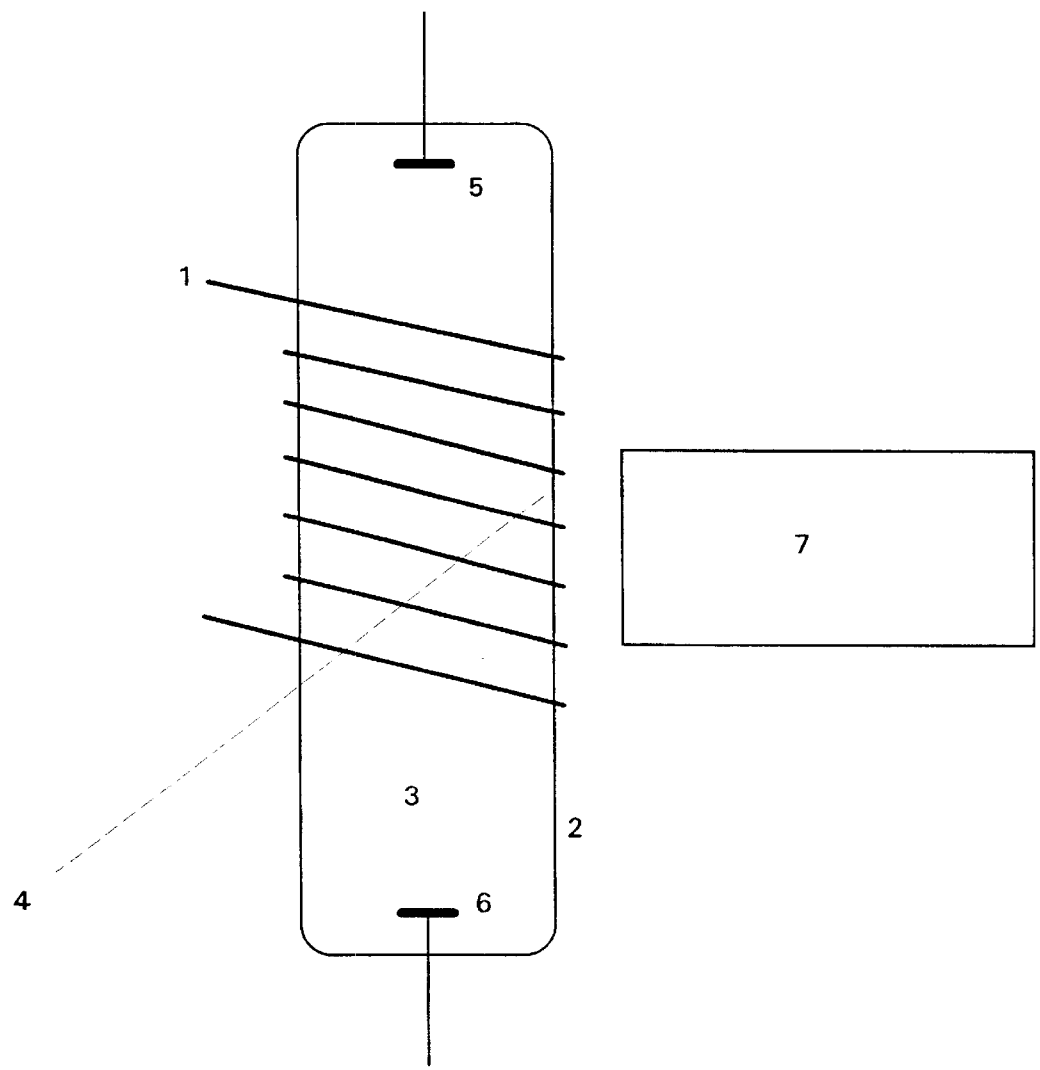
FIG. 3 General schematic diagram of the radiofrequency gaseous detection device with an alternating electromagnetic field.

A further embodiment of the invention suitable for general purpose applications is shown in FIG. 3. An alternating electromagnetic field is generated by an alternating electric current passing through coil 1 wherein a glass container 2 with a suitable gas 3 is located. An ionising radiation 4 traverses the gas and generates free electrons which are then multiplied by the action of the alternating electromagnetic field. The amplified electrons and ions are collected by the anode 5 and cathode 6, which are connected to an external electronics circuit. Alternatively, or additionally, the photon avalanche generated in the gas is collected by a light pipe 7 leading to a photomultiplier, or other photo-sensitive device for further processing according to known art.

It will be appreciated that the embodiments of FIGS. 1, 2 and 3 do not limit the scope of the present invention. It will be apparent to those skilled in the art that various changes, alternatives, or modifications may be made therein without departing from the spirit of the invention. The use of coils instead of plates can be used also in instruments employing charged particle beams. The choice of electrode configurations and materials may vary and depends on the particular industrial application without departing from the scope and spirit of the present invention.

Ancillary electrodes can be used according to known art in order to integrate this invention with particular industrial instruments. Such electrodes can be used to guard the incident beam, to shape the electric field, to separate, or suppress, or extract electrons and ions in the gaseous environment. Non-axially symmetric electrode configurations are also used. The configuration can vary in direction and distance from the axis of the system. Multiple sets of detecting and ancillary electrodes can be used. The bias of electrodes can vary.

Light guides/pipes and optical fibres can be inserted in order to collect and detect the photons generated in the gaseous environment.

INDUSTRIAL APPLICABILITY

The detector of the present invention can be incorporated or integrated with various instruments such as those mentioned below:

In one application, the detector of the present invention can be integrated, or incorporated with an environmental scanning electron microscope (ESEM). The electron beam of the microscope interacts with a specimen and releases various ionising signals. The specimen is surrounded by a gaseous environment and the generated signals ionise the gas. An alternating electromagnetic field is applied to the ionised gas and an electron and photon avalanche is generated as disclosed by the present invention. The amplified signals are collected as described above.

In another application, the detector of the present invention can be integrated, or incorporated with a scanning electron microscope (SEM). A SEM must also comprise means to admit some minimum amount of gas around the specimen which releases ionising signals after the electron beam strikes the specimen. The ionising radiations are subsequently detected by the device of the present invention as described above.

In a further application, the detector of the present invention can be integrated, or incorporated with a scanning transmission electron microscope (STEM), which is modified to allow some minimum amount of gas in its specimen chamber. Again, the electron beam interacts with the specimen and releases ionising signals which are subsequently detected by the device of the present invention.

In yet further applications, the detector of the present invention can be integrated, or incorporated with ion beam instruments including those used in micro-fabrication and testing technology. The ion beam strikes a specimen and releases ionising signals. A minimum pressure gaseous envelope must surround the specimen and the present detector is applied as disclosed herein.

In an additional application, the present invention can be used to make a novel proportional particle counter for applications in particle physics. An external radiation ionises the gas of the detector and the signal is amplified as described by the present invention.

The system of electrodes referred to in this invention can be integrated with operating parts of other instruments. Thus, the alternating field generating electrodes, or the detecting and ancillary electrodes can be parts of an electron optics column, or parts of a differential pumping system.

It would be apparent by those skilled in the art that the above industrial applications are only part of a broader series of applications of the present invention to various instruments and uses.

One advantage of the present invention is that it allows the detection and amplification of signals in a gaseous environment of relatively low pressure.

Another advantage is that it is used with any pressure of gas in the specimen chamber, thus providing new detection means in instruments used for testing, imaging and micro-fabrication. ESEM is a particular application of the present invention.

Another advantage is that it gives a better signal output.

Another advantage is the ease of hardware design.

Another advantage is that it provides alternative means of detection to existing technologies, which allows more diverse and competitive manufacturing industries.

REFERENCE

1. Danilatos G D. U.S. Pat. No. 4,596,928. Method and apparatus for an atmospheric scanning electron microscope, filed May 14, 1984.
2. Danilatos G D. European Pat. Specification, Contracting State: DE (Germany), Publication Number 0 022 356 B1. Scanning electron microscope and detection configuration therefor, filed Jul. 3, 1980.
3. Danilatos G D. U.S. Pat. No. 4,992,662. Multipurpose gaseous detector device for electron microscope, filed Sep. 13, 1989.
4. Mancuso J F, Maxwell W B, Danilatos G D. U.S. Pat. No. 4,785,182. Secondary electron detector for use in a gaseous atmosphere, filed May 21, 1987.
5. Danilatos G D, Lewis G C. U.S. Pat. No. 4,823,006. Integrated electron optical differential pumping/imaging signal detection system for an environmental scanning electron microscope, filed Feb. 19, 1988.
6. Danilatos G D. U.S. Pat. No. 4,897,545. Electron detector for use in a gaseous environment, filed Oct. 14, 1988.
7. Danilatos G D. Foundations of Environmental Scanning Electron Microscopy, Advances in Electronics and Electron Physics, Vol. 71, 109–250(1988).
8. Danilatos G D. Cathodoluminescence and gaseous scintillation in the environmental SEM, SCANNING, Vol. 8, 279–284(1986).
9. Danilatos G D. Theory of the Gaseous Detector Device in the Environmental Scanning Electron Microscope, Advances in Electronics and Electron Physics, Vol. 78, 1–102(1990).
10. Danilatos G D. Secondary-electron imaging by scintillating gaseous detection device, Proceedings of 50$^{th}$ Annual Meeting of the Microscopy Society of America, 1302–1303(1992).
11. Thomson J. On the mechanism of the electrodeless discharge, Phil. Mag., Vol. 10, 280–291(1930).
12. Thomson J. Sparking potentials at ultra-high frequencies, Phil. Mag., Vol. 23, 1–24(1937).
13. Townsend J S. Generalisation of the theory of electrical discharges, Phil. Mag., Vol. 26, 290–311(1938).
14. Nisewanger C R, Holmes J R and Weissler G L. Electrodeless discharges at high frequencies and low pressures, J. Optical Soc. Amer., Vol. 36, 581–587(1946).
15. Gill E W B and Engel A. Starting potentials of electrodeless discharges, Royal Society of London, Series A, Vol. 197, 107–124(1949).

what I claim is:

1. A device for detection of ionising signals, which comprises:
   (a) means for generating a time-continuous alternating electromagnetic field with variable amplitude and variable frequency of oscillation;
   (b) a set of electrodes biased with a static voltage to generate a static electric field superimposed with said alternating electromagnetic field;
   (c) an envelope containing gas wherein said alternating electromagnetic field and said static electric field act;
   (d) pressure of said gas in the range from near vacuum to one atmosphere;
   (e) a source of ionising radiation which initially releases free electrons in said gas;
   (f) at sufficiently low pressure, electrical discharge generated by oscillatory motion of said initial free electrons being acted upon by said alternating electromagnetic field, said oscillatory motion producing ions which together with electrons strike adjacent walls of suitable configuration and materials wherefrom further electrons are released, the process resulting in a cascade multiplication of electrons and photons;
   (g) at sufficiently high pressure, electrical discharge generated by oscillatory motion of said initial free electrons being acted upon by said alternating electromagnetic field, said oscillatory motion producing multiple collisions with gas molecules or atoms, one portion of said collisions producing additional free electrons and ions, another portion of said collisions producing photons, all of said free electrons, ions and photons multiplying in an avalanche form;
   (h) said electrical discharge being controlled by varying the intensity of said alternating and static fields in a manner whereby the discharge is sustained only while the source of ionising radiation is present but said electrical discharge is extinguished when the ionising radiation source is removed, said discharge producing an amplified output signal in proportion to the intensity of the ionising source;
   (i) means for collecting the generated output signals of electrical current and photons;
   (g) known electronics techniques to separate and process the useful output signal for purposes of measuring, counting, quantifying, qualifying, imaging and analysis of the causal ionising source.

2. A device according to claim 1 wherein said means for generating an alternating electromagnetic field comprises a set of electrodes biased with an alternating voltage having (i)

variable frequency, preferably but not limited, in the radiofrequency range between 1 MHz ($10^6$ Herz) and 1 GHz ($10^9$ Herz) and (ii) variable amplitude of oscillation, preferably but not limited, in the range between 1–1000 V (volts).

3. A device according to claim 1 wherein said means for generating an alternating electromagnetic field comprises a coil through which an alternating electric current flows having (i) variable frequency, preferably but not limited, in the radiofrequency range between 1 MHz ($10^6$ Herz) and 1 GHz ($10^9$ Herz) and (ii) variable amplitude of oscillation.

4. A device according to claim 1 wherein said means for collecting the amplified output signal comprises a set of electrodes biased with a voltage to attract the electrons and ions generated in said gas.

5. A device according claim 1 wherein said means for collecting the amplified output signal comprises a set of light guides and pipes leading to a photosensitive apparatus for the detection of photons generated in said gas.

6. A device according to claim 1, which, in addition, comprises a magnetic (static or alternating) field that overlaps with said alternating electromagnetic field.

7. A device according to claim 1, which, in addition, comprises an ancillary set of biased electrodes inserted for purposes of guarding and separating various useful signals, or for separating useful signals from interference, noise, or unwanted signals.

8. A device according to, claim 1 wherein anyone of said electrodes may be used simultaneously to combine anyone of said electrode functions, namely,
   (a) the function of generating said alternating electromagnetic field;
   (b) the function of generating said static electric field;
   (c) the function of collecting said amplified output signal;
   (d) the function of guarding and separating of any of said signals.

9. A device according to claim 1 wherein said electrodes have the form of plates, wires, or meshes configured as a plurality of electrode arrays on one or more separate planes.

10. A device according to claim 1 wherein said electrodes are made of conductive, semiconductive, or resistive materials.

11. A device according to claim 1 wherein said ionising source emanates from the interaction of a focussed electron beam impinging on a specimen.

12. A device according to claim 1 wherein said ionising source emanates from the interaction of a focussed ion beam impinging on a specimen.

13. A device according to claim 1 wherein said ionising source emanates from a radioactive material, or a cosmic radiation.

14. A scanning electron microscope which comprises:
   (a) a device according to claim 11 wherein said electron beam is the electron beam of the microscope;
   (b) means for allowing a gas envelope of sufficient pressure around said specimen which is placed in the specimen chamber of the microscope.

15. An environmental scanning electron microscope which comprises:
   (a) a device according to claim 11 wherein said electron beam is the electron beam of the microscope;
   (b) said specimen being placed in the specimen chamber of the microscope.

16. A scanning transmission electron microscope which comprises:
   (a) a device according to claim 11 wherein said electron beam is the electron beam of the microscope;
   (b) means for allowing a gas envelope of sufficient pressure around said specimen which is placed in the specimen chamber of the microscope.

17. A proportional counter which comprises a device according to claim 13.

18. Any apparatus which incorporates or integrates a device according to claim 1.

19. A method of electron detection comprising the steps of:
   (a) generating a time-continuous alternating electromagnetic field with variable amplitude and variable frequency of oscillation;
   (b) superimposing a static electric field with said alternating electromagnetic field;
   (c) introducing a gas in the space acted upon by said alternating electromagnetic field and said static electric field with a pressure anywhere between near vacuum to one atmosphere;
   (d) releasing electrons in said gas by an agent;
   (e) at sufficiently low pressure, electrical discharge generated by oscillatory motion of said initial free electrons being acted upon by said alternating electromagnetic field, said oscillatory motion producing ions which together with electrons strike adjacent walls of suitable configuration and materials wherefrom further electrons are released, the process resulting in a cascade multiplication of electrons and photons;
   (f) at sufficiently high pressure, generating electrical discharge by oscillatory motion of initially released electrons being acted upon by said alternating electromagnetic field, said oscillatory motion producing multiple collisions with gas molecules or atoms, one portion of said collisions producing additional free electrons and ions, another portion of said collisions producing photons, all of said free electrons, ions and photons multiplying in an avalanche form;
   (g) controlling said electrical discharge by varying the intensity of said alternating and static fields in a manner whereby the discharge is sustained only while the source of releasing electrons is present but said electrical discharge is extinguished when said source is removed, said discharge producing an amplified output signal in proportion to the intensity of the source electrons;
   (h) collecting the generated output signals of electrical current and photons;
   (i) using known electronics techniques to separate and process the useful output signal for purposes of measuring, counting, quantifying, qualifying, imaging and analysis of the causal ionising source.

20. Any method which incorporates or integrates a method according to claim 18.

* * * * *